United States Patent
Sims et al.

(10) Patent No.: US 10,020,188 B2
(45) Date of Patent: Jul. 10, 2018

(54) METHOD FOR DEPOSITING ALD FILMS USING HALIDE-BASED PRECURSORS

(71) Applicant: LAM RESEARCH CORPORATION, Fremont, CA (US)

(72) Inventors: James S. Sims, Tigard, OR (US); Jon Henri, West Linn, OR (US); Ramesh Chandrasekharan, Portland, OR (US); Andrew John McKerrow, Lake Oswego, OR (US); Seshasayee Varadarajan, Lake Oswego, OR (US); Kathryn Merced Kelchner, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/817,579

(22) Filed: Nov. 20, 2017

(65) Prior Publication Data

US 2018/0102245 A1 Apr. 12, 2018

Related U.S. Application Data

(63) Continuation of application No. 15/287,176, filed on Oct. 6, 2016, now Pat. No. 9,824,884.

(51) Int. Cl.
*H01L 21/02* (2006.01)
*H01J 37/32* (2006.01)
(Continued)

(52) U.S. Cl.
CPC ...... *H01L 21/0228* (2013.01); *C23C 16/0227* (2013.01); *C23C 16/0272* (2013.01);
(Continued)

(58) Field of Classification Search
CPC ............ H01L 21/0228; H01L 21/0217; H01L 21/02211; H01L 21/02274;
(Continued)

(56) References Cited

U.S. PATENT DOCUMENTS 5,614,026 A 3/1997 Williams
7,601,648 B2 10/2009 Chua et al.
(Continued)

FOREIGN PATENT DOCUMENTS

KR 10-2014-0099214 A 8/2014

OTHER PUBLICATIONS

International Search Report and Written Opinion dated Dec. 27, 2017 in corresponding International Patent Application No. PCT/US2017/052138 (14 pages).

*Primary Examiner* — Savitr Mulpuri
(74) *Attorney, Agent, or Firm* — Buchanan Ingersoll & Rooney PC (57) ABSTRACT

A method of depositing ALD films on semiconductor substrates processed in a micro-volume of a plasma enhanced atomic layer deposition (PEALD) reaction chamber wherein a single semiconductor substrate is supported on a ceramic surface of a pedestal and process gas is introduced through gas outlets in a ceramic surface of a showerhead into a reaction zone above the semiconductor substrate, includes (a) cleaning the ceramic surfaces of the pedestal and showerhead with a fluorine plasma such that aluminum-rich byproducts are formed on the ceramic surfaces, (b) depositing a conformal halide-free atomic layer deposition (ALD) oxide undercoating on the ceramic surfaces so as to cover the aluminum-rich byproducts, (c) depositing a pre-coating on the halide-free ALD oxide undercoating, and (d) processing a batch of semiconductor substrates by transferring each semiconductor substrate into the reaction chamber and (Continued)

depositing a film on the semiconductor substrate supported on the ceramic surface of the pedestal.

18 Claims, 5 Drawing Sheets

(51) Int. Cl.
    *C23C 16/455*     (2006.01)
    *C23C 16/50*     (2006.01)
    *C23C 16/34*     (2006.01)
    *C23C 16/02*     (2006.01)

(52) U.S. Cl.
    CPC ...... *C23C 16/345* (2013.01); *C23C 16/45525* (2013.01); *C23C 16/50* (2013.01); *H01J 37/32082* (2013.01); *H01J 37/32532* (2013.01); *H01L 21/0217* (2013.01); *H01L 21/02211* (2013.01); *H01L 21/02274* (2013.01); *H01J 2237/335* (2013.01); *H01J 2237/3321* (2013.01)

(58) Field of Classification Search
    CPC ............ C23C 16/0227; C23C 16/0272; C23C 16/345; C23C 16/45525; C23C 16/50; H01J 37/32082; H01J 37/32532; H01J 2237/335; H01J 2237/3321
    See application file for complete search history.

(56) References Cited

U.S. PATENT DOCUMENTS

| | | | |
|---|---|---|---|
| 7,737,035 B1 | 6/2010 | Lind et al. | |
| 7,858,510 B1 * | 12/2010 | Banerji | C23C 16/0227 257/E21.269 |
| 7,910,497 B2 | 3/2011 | Olsen et al. | |
| 8,592,328 B2 | 11/2013 | Hausmann et al. | |
| 8,637,411 B2 * | 1/2014 | Swaminathan | C23C 16/045 438/702 |
| 8,647,904 B2 * | 2/2014 | Araki | H01L 21/0237 257/E21.001 |
| 8,728,956 B2 | 5/2014 | LaVoie et al. | |
| 9,070,555 B2 | 6/2015 | Hausmann et al. | |
| 9,184,086 B2 | 11/2015 | Park et al. | |
| 9,214,333 B1 | 12/2015 | Sims et al. | |
| 9,287,113 B2 * | 3/2016 | Kang | C23C 16/345 |
| 9,362,109 B2 | 6/2016 | Pore | |
| 9,373,500 B2 | 6/2016 | Swaminathan et al. | |
| 9,378,971 B1 | 6/2016 | Briggs et al. | |
| 9,441,296 B2 | 9/2016 | Sabri et al. | |
| 9,502,238 B2 * | 11/2016 | Danek | H01L 21/0228 |
| 9,543,148 B1 | 1/2017 | Hudson et al. | |
| 9,543,158 B2 | 1/2017 | Hudson et al. | |
| 9,564,312 B2 | 2/2017 | Henri et al. | |
| 9,589,790 B2 | 3/2017 | Henri et al. | |
| 9,601,693 B1 | 3/2017 | Henri et al. | |
| 9,824,941 B2 * | 11/2017 | Sakiyama | H01L 22/20 |
| 9,865,455 B1 * | 1/2018 | Sims | H01L 21/02274 |
| 2005/0181633 A1 | 8/2005 | Hochberg et al. | |
| 2006/0280868 A1 | 12/2006 | Kato et al. | |
| 2006/0286776 A1 | 12/2006 | Ranish et al. | |
| 2012/0180810 A1 | 7/2012 | Beckmann et al. | |
| 2013/0189854 A1 | 7/2013 | Hausmann et al. | |
| 2014/0053867 A1 | 2/2014 | Fang et al. | |
| 2014/0141626 A1 | 5/2014 | Hausmann et al. | |
| 2014/0158792 A1 | 6/2014 | Meinhold et al. | |
| 2015/0004798 A1 | 1/2015 | Chandrasekharan et al. | |
| 2015/0011096 A1 | 1/2015 | Chandrasekharan et al. | |
| 2015/0147482 A1 | 5/2015 | Kang et al. | |
| 2015/0203967 A1 | 7/2015 | Dhas et al. | |
| 2015/0218701 A1 | 8/2015 | Bartlett et al. | |
| 2015/0259791 A1 | 9/2015 | Hausmann et al. | |
| 2016/0020092 A1 | 1/2016 | Kang et al. | |
| 2016/0056032 A1 | 2/2016 | Baldasseroni et al. | |
| 2016/0148800 A1 | 5/2016 | Henri et al. | |
| 2016/0148806 A1 | 5/2016 | Henri et al. | |
| 2016/0163539 A9 | 6/2016 | Kang et al. | |
| 2016/0203952 A1 | 7/2016 | Tucker et al. | |
| 2016/0281230 A1 | 9/2016 | Varadarajan et al. | |

* cited by examiner

METHOD FOR DEPOSITING ALD FILMS USING HALIDE-BASED PRECURSORS

CROSS REFERENCE TO RELATED APPLICATIONS

This application is a continuation application of U.S. patent application Ser. No. 15/287,176, filed Oct. 6, 2016, which will issue as U.S. Pat. No. 9,824,884 on Nov. 21, 2017, the contents of which is incorporated by reference herein in its entirety.

BACKGROUND

As the semiconductor industry advances, device dimensions are becoming increasingly smaller. These progressively smaller features require deposition procedures that are extremely uniform, as the presence of film impurities or other non-uniformities can often lead to the failure of a semiconductor device. An undercoat on interior chamber surfaces can help improve wafer-to-wafer thickness uniformity and within-wafer thickness uniformity.

SUMMARY

Disclosed herein is a method of depositing silicon nitride films on a semiconductor substrate processed in a micro-volume of a plasma enhanced atomic layer deposition (PEALD) reaction chamber wherein the semiconductor substrate is supported on a ceramic surface of a pedestal and process gas is introduced through gas outlets in a ceramic surface of a showerhead into a reaction zone above the semiconductor substrate. The method includes cleaning the ceramic surfaces, depositing an undercoating on the ceramic surfaces, depositing a pre-coating over the undercoating, and sequentially processing a batch of semiconductor substrates in the processing region by transferring the semiconductor substrates one at a time into the processing region and depositing a silicon nitride film on each semiconductor substrate. After a predetermined number of semiconductor substrates are processed and/or film accumulation on the interior surfaces reaches a predetermined thickness, the cleaning, undercoating and pre-coating steps can be repeated before processing another batch of semiconductor substrates.

In one aspect of the embodiments herein, silicon nitride films are deposited on semiconductor substrates processed in a plasma enhanced atomic layer deposition (PEALD) reaction chamber wherein a single semiconductor substrate is supported on a ceramic surface of a pedestal and process gas is introduced through gas outlets in a ceramic surface of a showerhead into a reaction zone above the semiconductor substrate. The method comprises (a) cleaning the ceramic surfaces of the pedestal and showerhead with a fluorine plasma, (b) depositing a halide-free atomic layer deposition (ALD) oxide undercoating on the ceramic surfaces, (c) depositing a pre-coating of ALD silicon nitride on the halide-free ALD oxide undercoating, and (d) processing a batch of semiconductor substrates by sequentially transferring each semiconductor substrate into the reaction chamber and depositing a film of ALD silicon nitride on the semiconductor substrate supported on the ceramic surface of the pedestal.

In forming the undercoating, the method can be carried out by (i) introducing a flow of a halogen-free silicon-containing first reactant in vapor phase into the reaction chamber and allowing the first reactant to adsorb onto the ceramic surfaces of the reaction chamber; (ii) introducing a flow of an oxygen-containing second reactant in vapor phase into the reaction chamber while the first reactant is adsorbed on the ceramic surfaces of the reaction chamber; and (iii) exposing the reaction chamber to plasma when the flow of at least one of the first and second reactants has ceased, in order to drive a reaction between the first and second reactants on the ceramic surfaces of the reaction chamber to form the undercoating, where the undercoating conformally coats the ceramic surfaces of the reaction chamber; wherein operations (i)-(iii) occur when there is no semiconductor substrate present in the reaction chamber, and wherein operations (i)-(iii) are repeated until the undercoating is at least about 500 Å thick.

In accordance with another embodiment, films are deposited on semiconductor substrates processed in a micro-volume of a plasma enhanced atomic layer deposition (PEALD) reaction chamber wherein a single semiconductor substrate is supported on a ceramic surface of a pedestal and process gas is introduced through gas outlets in a ceramic surface of a showerhead into a reaction zone above the semiconductor substrate. The method comprises (a) cleaning the ceramic surfaces of the pedestal and showerhead with a fluorine plasma such that aluminum-rich byproducts are formed on the ceramic surfaces; (b) depositing a conformal halide-free atomic layer deposition (ALD) oxide undercoating on the ceramic surfaces so as to cover the aluminum-rich byproducts; (c) depositing a pre-coating on the halide-free ALD oxide undercoating; and (d) processing a batch of semiconductor substrates by transferring each semiconductor substrate into the reaction chamber and depositing a film on the semiconductor substrate supported on the ceramic surface of the pedestal.

The conformal halide-free ALD oxide undercoating can be formed by (i) introducing a flow of a halogen-free silicon-containing first reactant in vapor phase into the reaction chamber and allowing the first reactant to adsorb onto the interior surfaces of the reaction chamber; (ii) introducing a flow of an oxygen-containing second reactant in vapor phase into the reaction chamber while the first reactant is adsorbed on the interior surfaces of the reaction chamber; and (iii) exposing the reaction chamber to plasma when the flow of at least one of the first and second reactants has ceased, in order to drive a reaction between the first and second reactants on the interior surfaces of the reaction chamber to form the undercoating, where the undercoating conformally coats the interior surfaces of the reaction chamber; where operations (i)-(iii) occur when there is no substrate present in the reaction chamber, and where operations (i)-(iii) are repeated until the undercoating is at least about 500 Å thick. Preferably, the ceramic surfaces of the showerhead and pedestal are aluminum nitride, step (a) is carried out at with the pedestal and showerhead at a temperature below 400° C., and step (c) is carried out with the pedestal and showerhead at a temperature above 400° C. In addition, the undercoating can be deposited to a thickness of at least 500 Å, step (c) can be carried out with the pedestal and showerhead at a temperature of about 475° C. to about 635° C., and step (a) can be carried out with the pedestal and showerhead at a temperature below 300° C. Preferably, step (a) is carried out with $NF_3$ energized into a plasma state upstream from the micro-volume using a remote inductively coupled plasma generator or by flowing $NF_3$ into the micro-volume and energizing the $NF_3$ into a plasma state within the micro-volume by applying RF power to an embedded RF electrode in the showerhead.

DETAILED DESCRIPTION

Front-end-of-line (FEOL) films have stringent in-film metals requirements since these films are deposited in close proximity to the active area of the device. Typical FEOL in-film metals specs are $<1\times10^{10}$ atoms/cm$^2$ for most metals, including aluminum (Al). For high-throughput, high-conformality atomic layer deposition (ALD) silicon nitride films, only halide-based silicon precursors have the reactivity required to make manufacturable films for most applications.

Halide-based chemistry in general, and chlorine based (Cl-based) silicon precursors in particular, will attack Al chamber parts and make volatile byproducts, such as AlCl$_3$ at temperatures >150° C., that can be incorporated into the film. For this reason, the chamber components near the semiconductor substrate (wafer) that will be exposed to halide chemistry are made of ceramic material such as aluminum nitride (AlN) to prevent Al corrosion. While AlN ceramic in the as-received state is inert to halide-based chemistries, AlN exposed to NF$_3$-based chamber cleans will have Al-containing compounds generated on the surface during chamber cleaning that will subsequently be attacked by halide-based chemistry, generating volatile Al compounds that are incorporated in the film deposited on the semiconductor substrates.

For Cl-based ALD nitride film formation, post-clean reactive surface compounds can eventually be covered up by a time consuming ALD SiN pre-coat that eventually drops the in-film Al concentration below the specified limit. Unfortunately, the amount of ALD SiN pre-coat required is not very repeatable and can take over 48 hours of deposition time to get to a point where the in-film metals meet specified limits and product wafers can finally be processed. This approach is too long and unrepeatable for a production environment, and severely limits the number of wafers that can be processed metals-free before the accumulation limit is reached and another chamber clean needs to be run.

As disclosed herein, a method has been developed which can be used with Lam Research Corporation's Striker Nitride™ virtual seal chamber design, which enables deposition of high-throughput ALD SiN films that meet FEOL metals requirements repeatably, without the need for excessive ALD SiN pre-coats. The method for high-temperature halide-based ALD SiN processes, with a typical pedestal temperature of 475° C. to 635° C., is to drop the pedestal temperature to <400° C., run the NF$_3$-based clean, ramp the temperature back up to process temperature, and coat the chamber interior surfaces with a halide-free, fast ALD oxide undercoat. Running the chamber clean at temperatures of 400° C. or less slows the kinetics of the NF$_3$ reaction with AlN enough so that the amount of Al-containing byproducts generated is held to a level that can be covered with a reasonable amount of halide-free ALD oxide undercoat on the order of 2,000 Å or less, preferably about 1,000 Å or less. Since the ALD oxide process is fast, a 1,000 Å undercoat can be deposited in 1 to 1½ hours, which is a tolerable amount of time for ALD SiN since chamber cleans would only be run every 3-4 days in production. The choice of a halide-free ALD oxide undercoat is the result of experimentally testing a selection of alternate undercoats, such as PECVD oxide and halide-based ALD oxide. The results of the tests show that only a highly conformal, fast, halide-free ALD oxide film successfully meets the requirements of very low post-clean metals in a manufacturable way.

The Striker Nitride™ virtual seal design provides a small volume processing region (micro-volume) which contains the gases and byproducts produced during the cleaning, undercoating, pre-coating and silicon nitride deposition steps. The deposition and clean chemistry reactants can be confined to the wafer cavity, which can be coated completely with an ALD oxide undercoat. This containment is useful for temporal ALD since pressure cycling is used in between dose and conversion half-reaction cycles to ensure the respective chemistries do not mix. This pressure cycling introduces multiple AlCl$_3$ transport modes that demand the reactive chemistry be contained in order to suppress metals incorporation into the SiN film. The method is useful for halide-based ALD SiN processes deposited at a temperature less than 400° C. as well, since post-clean metals testing showed that Al-containing byproducts are still generated at clean temperatures of 250° C. or less. A non-halide ALD oxide undercoat can prove useful for suppressing metals in PECVD reactors as well, since the undercoat testing clearly showed that PECVD oxide undercoats were inferior in terms of covering potential metals sources.

The method disclosed herein provides a needed solution for temporal ALD single-wafer systems which, in general, require frequent, periodic NF$_3$-based cleans. Temporal reactors are so named because the wafers are stationary, but the half-reaction gases toggle back in forth with time. For processes with relatively slow kinetics, like ALD SiN, the time to toggle gases is short relative to the dose and conversion half-reaction times. In a spatial reactor, the gases are always on, but the wafers are moved through the dedicated, isolated volumes on a carousel. The speed with which the wafers can move is determined by the reaction kinetics. Spatial ALD mini-batch systems can avoid NF$_3$-based cleans since each half-reaction is confined to a dedicated chamber volume. This avoids film formation on the walls of the isolated chamber and obviates the need for frequent NF$_3$ chamber cleans. Furnace ALD systems can use quartz components to eliminate metals sources since they do not need to run frequent NF$_3$-based chamber cleans. Their isothermal design allows them to build up deposition on the walls until a system performance maintenance treatment is required, usually months apart. While furnace ALD and spatial mini-batch ALD systems can avoid post-NF$_3$ clean metals contamination, these reactors cannot exploit the benefits that temporal single-wafer ALD reactors can provide, such as axi-symmetric thickness profiles, lower chemical consumption, higher throughput for kinetically slow processes like SiN, uniform center-to-edge sidewall thickness on high aspect ratio features due to uniform chemical flux across the wafer, lower thermal budget, and graded film capability enabled through variable deposition temperature.

The Striker Nitride™ system enables the use of halide-based chemistry to deposit fast, conformal AlD SiN films in a temporal, single-wafer plasma enhanced atomic layer deposition (PEALD) tool. With a temporal ALD reactor, there is film formation on the walls and the wafer cavity must be cleaned with $NF_3$-based chemistry more frequently than the above-mentioned technologies. In order to take advantage of the many benefits of temporal ALD, the high post-clean metals issue must be overcome in a way that does not lower throughput and increase the cost of ownership to such an extent that the overall process is not manufacturable. These problems are overcome by combining a lower-temperature clean with a non-halide ALD oxide undercoat to enable metals-free ALD SiN wafer processing in a temporal reactor with minimal non-value-added overhead time. Lowering the clean temperature is desirable in order to slow down corrosion reactions between $NF_3$ and AlN. Since halide chemistry will react with these Al-containing corrosion byproducts, a non-halide ALD oxide undercoat can be used to suppress $AlX_y$ formation while covering up all the surfaces that will be exposed to the halide-based deposition chemistry. ALD oxide is beneficial because it is 100% conformal and will cover all surface irregularities in the wafer cavity—including faceplate and lift-pin holes. In addition, ALD oxide has fast kinetics which enable short cycle times and high deposition rates, which greatly reduce the undercoating time required to coat the wafer cavity. The Striker Nitride™ virtual seal design is advantageous in that it contains the deposition chemistry during pressure cycling to a region that can be thoroughly coated with the non-halide ALD oxide undercoat.

The method described herein is highly advantageous for deposition systems having a non-metallic (ceramic) chamber-in-chamber design. By providing such systems with an in situ, 100% conformal undercoat, it is possible to carry out repeated reduced-temperature in situ deposition/clean cycles prior to processing substrates with halide-based SiN chemistry. For a single wafer temporal tool, the combination of chemistry containment hardware and a fast, conformal, in situ non-halide ALD oxide undercoat for ALD SiN metals suppression offers low cost-of-ownership and materials flexibility compared to other alternatives. Time consuming ALD SiN pre-coats, which can take 48-72 hours, depending on chemistry, can severely limit tool availability. PECVD oxide undercoats have low conformality and cannot provide coverage of the highly irregular, rough surfaces of materials that are being attacked by clean chemistry. Protective liners can be used to protect chamber components from halide attack, but it is challenging, as well as expensive, to find liners/coatings that can survive thermal cycling and be resistant to halide deposition chemistry, $NF_3$-based and $O_2$-based cleans (needed for carbon-doped films). Thus, the method described herein improves uptime and cost-of-ownership further by eliminating the need for replaceable liners or frequent chamber openings to get rid of corrosive byproducts.

The method described herein can be carried out in deposition chambers having various types of showerhead arrangements. In general, there are two main types of deposition showerheads, the chandelier type and the flush mount. The chandelier showerheads have a stem attached to the top of the chamber on one end and the faceplate on the other end, resembling a chandelier. A part of the stem may protrude the chamber top to enable connection of gas lines and RF power. The flush mount showerheads are integrated into the top of a chamber and do not have a stem. In a preferred embodiment, a flush mount type showerhead can be used for purposes of reducing chamber volume such as disclosed in commonly-assigned U.S. Published Applications 2015/0004798 and 2015/0011096, the entire disclosures of which are hereby incorporated by reference.

Figure 1:
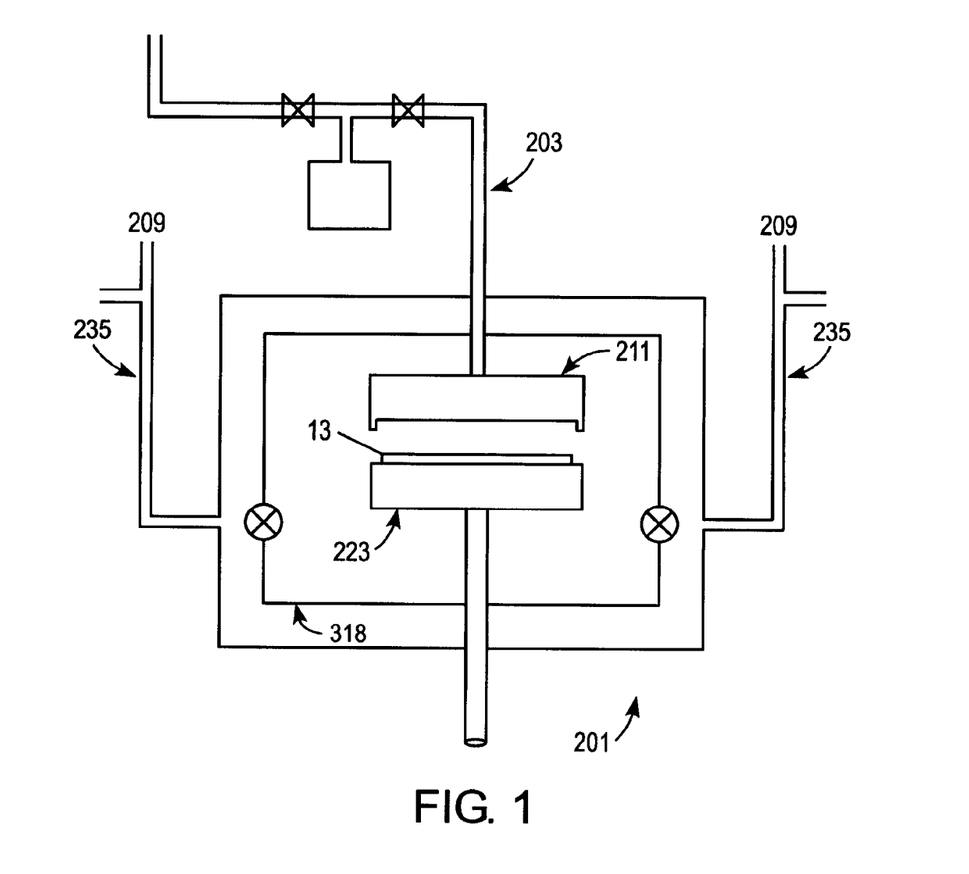
FIG. 1 illustrates a schematic diagram showing an overview of a chemical deposition apparatus in accordance with embodiments disclosed herein.

FIG. 1 is a schematic diagram showing an overview of a chemical deposition apparatus 201 in accordance with embodiments disclosed herein. A substrate 13 sits on top of a movable pedestal module 223 that can be raised or lowered relative to a showerhead module 211, which may also be moved vertically. Reactant material gases are introduced into a processing zone 318 of the chamber via gas line 203. Note that the apparatus may be modified to have one or more gas lines, depending on the number of reactant gases used. The chamber is evacuated through vacuum lines 235 that are connected to a vacuum source 209. The vacuum source may be a vacuum pump. By raising the pedestal, a micro-volume is located beneath showerhead module 211. Using a micro-volume, it is possible to limit exposure of corrosive process gases to aluminum chamber surfaces of the surrounding chamber in which the pedestal module and showerhead module are located. For processing 300 mm wafers, the micro-volume can range from 0.1 liter to 2 liters. During substrate processing, the pedestal module can be raised or lowered to expose a substrate to the micro-volume and/or to vary a volume of the micro-volume. For example, in a substrate transfer phase, the pedestal module can be raised to position a substrate within the micro-volume such that the micro-volume completely encloses the substrate as well as a portion of the pedestal module. However, instead of moving the pedestal module, a position of the showerhead module could be adjusted relative to the pedestal module to vary a volume of microvolume. Further, it will be appreciated that a vertical position of the pedestal module and/or showerhead module may be varied by any suitable mechanism and adjustments may be performed programmatically by one or more suitable controllers. The apparatus 201 can be a multi-station apparatus having a plurality of micro-volumes. For example, in a four station apparatus, the outer chamber can have an internal volume of 180 L in which four pedestals can be raised in close proximity to four showerheads to provide four micro-volumes.

Figure 2:
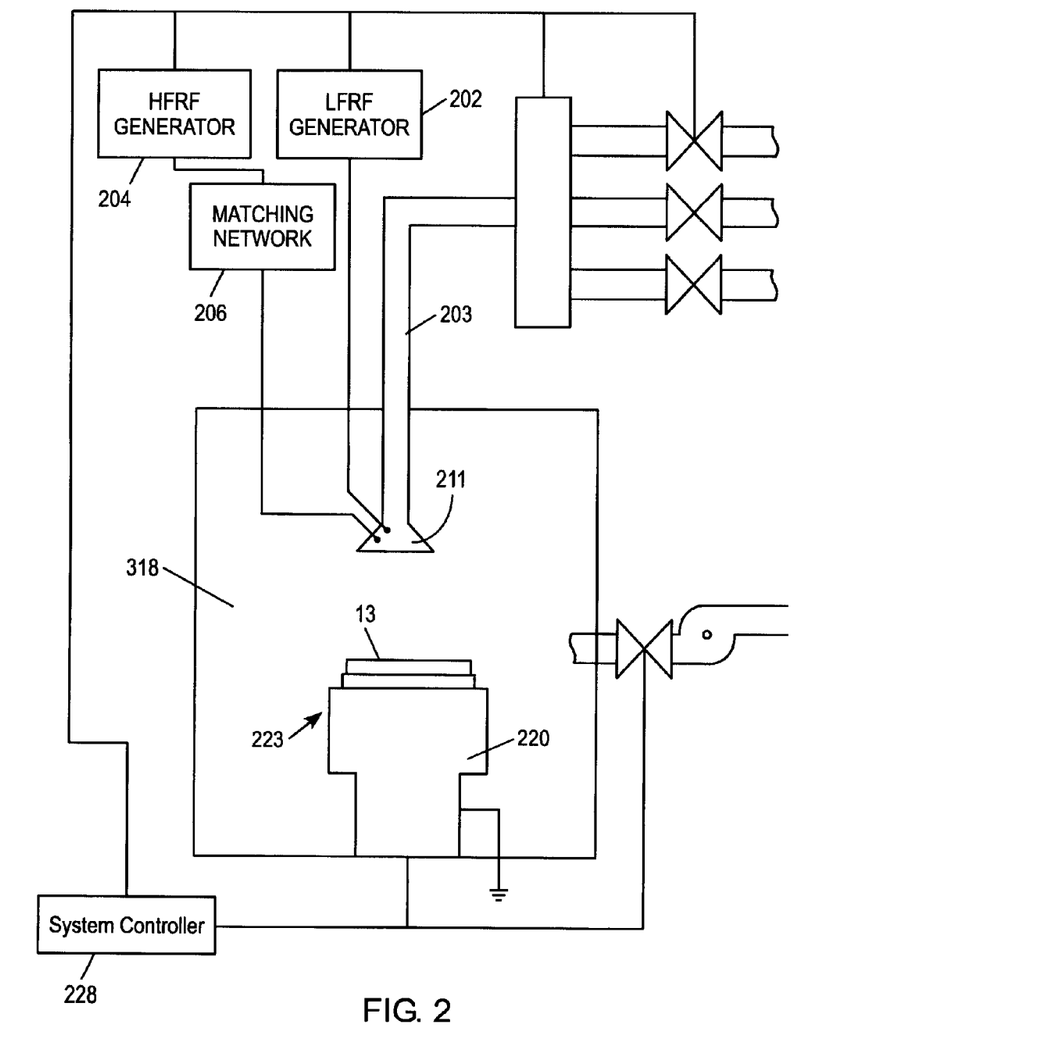
FIG. 2 illustrates a block diagram depicting various apparatus components arranged for implementing embodiments disclosed herein wherein plasma can be utilized to enhance deposition and/or surface reactions between reacting species during the generation of thin films.

FIG. 2 provides a simple block diagram depicting various apparatus components arranged for implementing embodiments disclosed herein wherein plasma is utilized to enhance deposition. As shown, a processing zone 318 serves to contain the plasma generated by a capacitively coupled plasma system including a showerhead module 211 working in conjunction with a pedestal module 223, wherein the pedestal module 223 is heated. RF source(s), such as at least one high-frequency (HF) RF generator 204, connected to a matching network 206, and an optional low-frequency (LF) RF generator 202 are connected to the showerhead module 211. In an alternative embodiment, the HF generator 204 can be connected to the pedestal module 223. The power and frequency supplied by matching network 206 is sufficient to generate plasma from the process gas/vapor. In an embodiment both the HF generator and the LF generator are used, and in an alternate embodiment, just the HF generator is used. In a typical process, the HF generator is operated generally at frequencies of about 2-100 MHz; in a preferred embodiment at 13.56 MHz or 27 MHz. The LF generator is operated generally at about 50 kHz to 2 MHz; in a preferred embodiment at about 350 to 600 kHz. The process parameters may be scaled based on the chamber volume, substrate size, and other factors. Similarly, the flow rates of process gas may depend on the free volume of the vacuum chamber or processing zone.

Within the chamber, the pedestal module 223 supports a substrate 13 on which materials such as thin films may be deposited. The pedestal module 223 can include a fork or lift pins to hold and transfer the substrate during and between the deposition and/or plasma treatment reactions. In an embodiment, the substrate 13 may be configured to rest on a surface of the pedestal module 223, however in alternate embodiments the pedestal module 223 may include an electrostatic chuck, a mechanical chuck, or a vacuum chuck for holding the substrate 13 on the surface of the pedestal module 223. The pedestal module 223 can be coupled with a heater block 220 for heating substrate 13 to a desired temperature. Generally, substrate 13 is maintained at a temperature of about 25° C. to 500° C. or greater depending on the material to be deposited.

In certain embodiments, a system controller 228 is employed to control process conditions during deposition, post deposition treatments, and/or other process operations. The controller 228 will typically include one or more memory devices and one or more processors. The processor may include a CPU or computer, analog and/or digital input/output connections, stepper motor controller boards, etc.

The controller 228 can be used to control all of the activities of the apparatus. The system controller 228 executes system control software including sets of instructions for controlling the timing of the processing operations, frequency and power of operations of the LF generator 202 and the HF generator 204, flow rates and temperatures of precursors and inert gases and their relative mixing, temperature of the heater block 220 and showerhead module 211, pressure of the chamber, and other parameters of a particular process. Other computer programs stored on memory devices associated with the controller may be employed in some embodiments.

Typically there will be a user interface associated with controller 228. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the wafer, pressure of the chamber and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the apparatus.

The system software may be designed or configured in many different ways. For example, various chamber component subroutines or control objects may be written to control operation of the chamber components necessary to carry out deposition processes. Examples of programs or sections of programs for this purpose include substrate timing of the processing steps code, flow rates and temperatures of precursors and inert gases code, and a code for pressure of the chamber.

Figure 3:
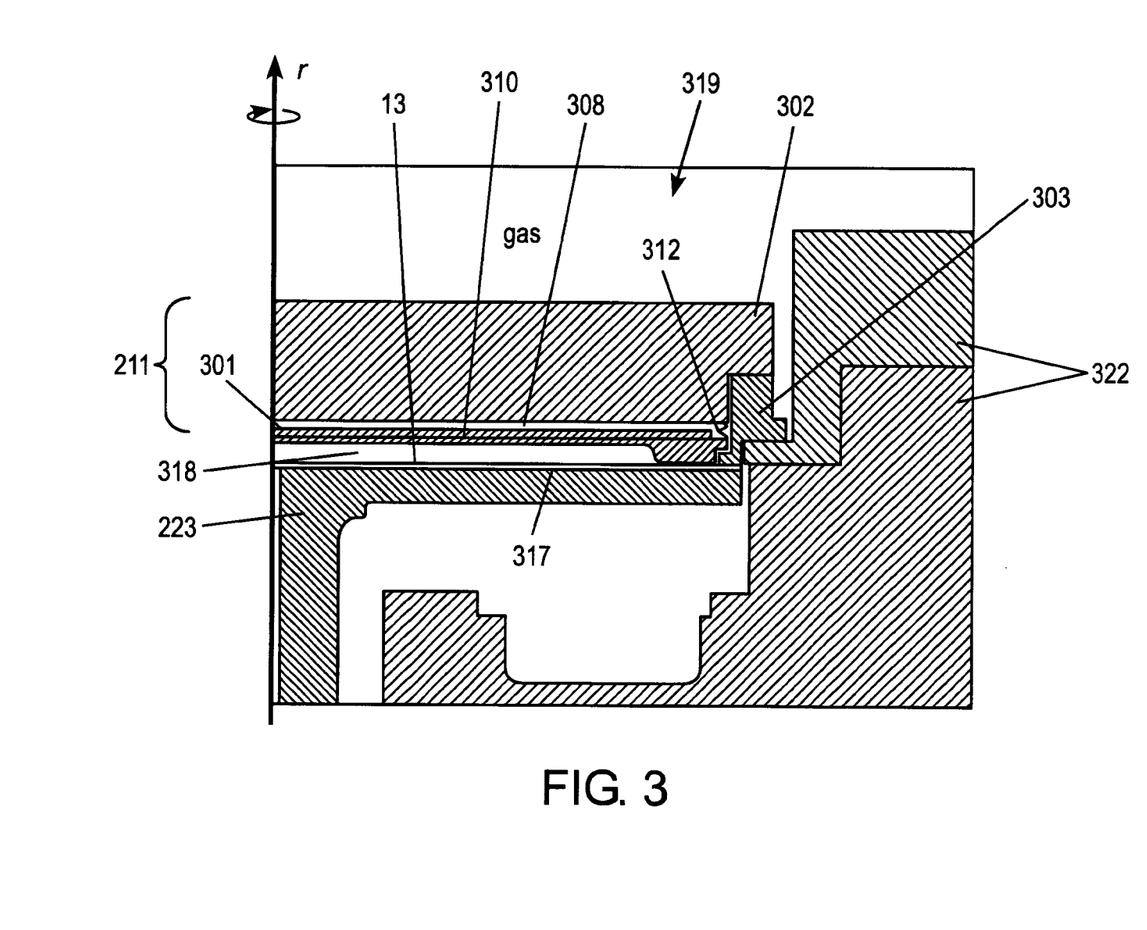
FIG. 3 illustrates a cross section of the pedestal module and the showerhead module arranged in accordance with embodiments disclosed herein.

FIG. 3 illustrates a cross section of a chemical isolation chamber 319 including the pedestal module 223 and the showerhead module 211 of FIGS. 1 and 2 in greater detail wherein the pedestal module 223 and showerhead module 211 form a cavity 318 in which a semiconductor substrate is processed. The cavity 318 is a micro-volume formed between the showerhead module 211 and the pedestal module 223 wherein a lower surface of a ceramic faceplate 301 of the showerhead module 211 forms an upper wall and a sidewall of the cavity 318, and an upper surface of the pedestal module 223 forms a lower wall of the cavity 318. An exemplary embodiment of a deposition apparatus which includes dual chamber seals can be found in commonly assigned U.S. Pat. No. 7,737,035, which is hereby incorporated by reference in its entirety.

The pedestal module 223 includes a bottom RF electrode 317 and the substrate 13 sits on the pedestal module 223. Preferably the bottom RF electrode 317 is grounded. The distance between the top of the substrate 13 and the bottom surface of the showerhead module 211 during processing is preferably about 5 to 16 millimeters. The pedestal module 223 includes a heater (see FIG. 2) and the faceplate 211 of the showerhead module 211 is heated from heat released from the pedestal module 223 during processing and by plasma struck in the cavity 318 during processing. In some embodiments, the temperature inside the chamber may be maintained through a heating mechanism in the showerhead module 211 and the pedestal module 223. Preferably, the substrate 13 is located in an isothermal environment. An isothermal processing zone is formed by maintaining each exposed surface of the cavity 318 at a desired temperature. The isothermal processing zone allows the substrate 13 to be uniformly heated and maintained at a desired temperature so that an undesired temperature gradient is not formed across the substrate 13. To form the isothermal processing zone, heat loss from the faceplate 301 to a backing plate 302 and heat loss from the faceplate 301 to an isolation ring 303 is minimized. In an embodiment, the showerhead module 211 can be heated to greater than about 250° C., and/or the pedestal module 223 can be heated to greater than about 250° C. to 500° C. or greater than about 500° C. In a preferred embodiment, each exposed surface of the cavity 318 is formed from a ceramic material such as aluminum nitride, aluminum oxide, silicon nitride, silicon carbide.

The showerhead module 211 includes the faceplate 301, the backing plate 302, and the isolation ring 303, wherein the isolation ring surrounds the faceplate 301 and the backing plate 302 and supports the backing plate 302. The isolation ring 303 is preferably formed from a ceramic material such as aluminum oxide ($Al_2O_3$) or aluminum nitride (AlN) and can be supported on a grounded chamber wall 322 of the chemical isolation chamber 319.

The backing plate 302 is formed from a metal material. For example the backing plate 302 can be formed from an aluminum alloy such as Al 6061 or stainless steel wherein the backing plate 302 can include a ceramic outer coating such as an aluminum oxide outer coating, a yttrium oxide outer coating, or a polymeric coating depending on the intended application. In a preferred embodiment, the backing plate 302 is RF hot, i.e., powered by an RF source. In an embodiment, the backing plate 302 can be a cooled backing plate. The faceplate 301 is preferably formed from a ceramic material and in preferred embodiments can be formed from aluminum oxide ($Al_2O_3$), or aluminum nitride (AlN). The faceplate 301 can include an RF electrode 310 embedded therein wherein the embedded RF electrode 310 is preferably a mesh electrode. A gas plenum 308 is formed between the faceplate 301 and the backing plate 302. Preferably the height of the gas plenum 308 between the faceplate 301 and the backing plate 302 enables good gas flow from the plenum 308 to the cavity 318 while providing minimal plenum volume. Preferably the height of the plenum 308 is about 2 to 6 mm. At least one RF contact 312 electrically connects the backing plate 302 and the RF electrode 310 embedded in the faceplate 301. In an embodiment, the RF contact 312 can be an annular RF contact made of a metallic strip having at least one bend wherein the RF contact 312 forms an outer perimeter of the gas plenum 308 between the faceplate 301 and the backing plate 302. Preferably the RF contact 312 forms a thermal choke between the faceplate 301 and the backing plate 302. Examples of ceramic faceplates with embedded RF electrodes can be found in commonly-assigned U.S. Pat. No. 9,441,296 and commonly-assigned U.S. Published Application 2016/0203952.

Figure 4:
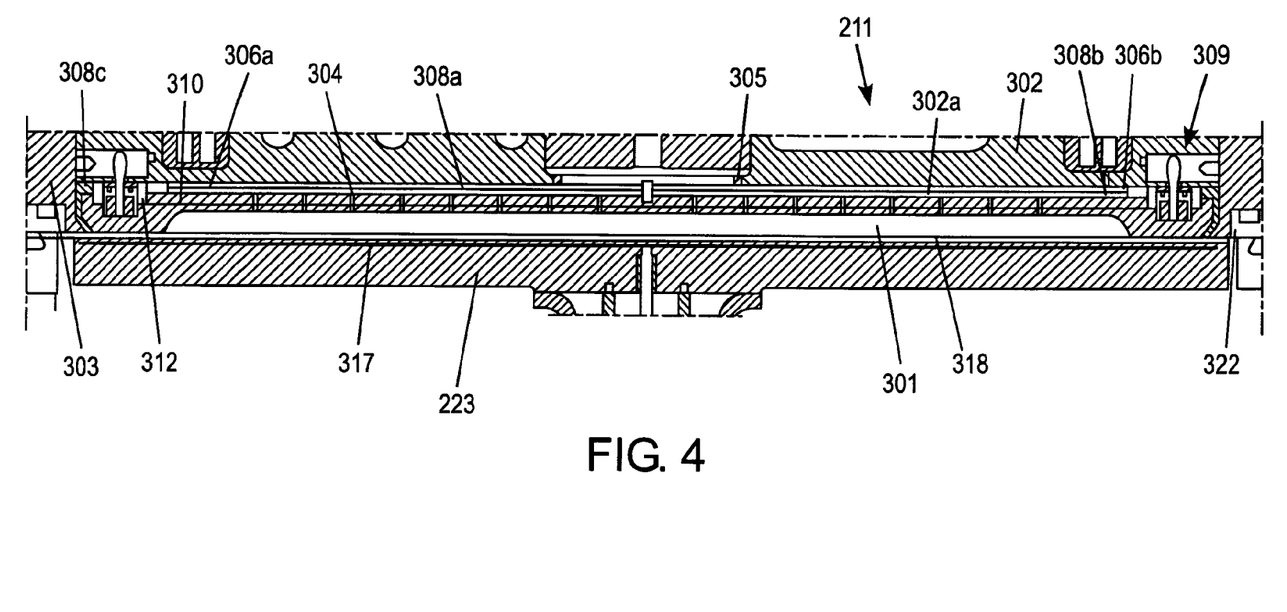
FIG. 4 illustrates a cross section of a showerhead module arranged in accordance with an embodiment disclosed herein.

FIG. 4 illustrates an exemplary embodiment of a showerhead module 211 and substrate support 223 which form an isothermal processing zone wherein a support element 309 attaches a faceplate 301 of the showerhead module 211 to the backing plate 302 of the showerhead module. Preferably each surface which is exposed to the isothermal processing zone is a ceramic surface which is maintained at a desired temperature. The showerhead module 211 includes a faceplate 301 wherein a lower surface of the faceplate forms an upper wall of a cavity 318 and optionally a sidewall of the cavity 318 defining the isothermal processing zone, a backing plate 302, and an isolation ring 303, wherein the isolation ring 303 surrounds the faceplate 301 and the backing plate 302. The backing plate 302 can include one or more gas inlets 305 and one or more gas outlets, and the faceplate 301 preferably includes a plurality of through holes 304 for delivering process gas to the isothermal processing zone, delivering inert gas to the isothermal processing zone, or removing process and/or inert gas from the isothermal processing zone. At least one compression seal can be located between the backing plate and the faceplate wherein each compression seal can form a boundary of at least one gas plenum. For example, two compression seals can be used to form gas plenums wherein the first compression seal is a first annular lever seal 306a which is compressed between the faceplate 301 and the backing plate 302 and wherein the first annular lever seal 306a forms an inner gas plenum 308a. The inner gas plenum 308a can be in fluid communication with the one or more gas inlets 305 of the backing plate 302 and a plurality of the through holes 304 of the faceplate 301 such that a process gas can be delivered therethrough into the cavity 318 which defines the isothermal processing zone. The second compression seal can be a second annular lever seal 306b which surrounds the first annular lever seal 306a and is compressed between the faceplate 301 and the backing plate 302 wherein the second annular lever seal 306a forms an intermediate plenum 308b which surrounds the inner gas plenum 308a. The intermediate plenum 308b can be in fluid communication with the one or more gas outlets 315 of the backing plate 302 and a plurality of the through holes 304 of the faceplate 301 such that a process gas can be removed from the isothermal processing zone in cavity 318 by the vacuum source. In an embodiment, an outer gas plenum 308c surrounds the intermediate plenum 308b. Preferably the outer gas plenum 308c can deliver inert gas to a gap between the faceplate 301 and the isolation ring 303 which is in fluid communication with the isothermal processing zone in cavity 318 and wherein the isolation ring 303 forms an outer periphery of the outer gas plenum 308c.

The faceplate can include outlets for removing gases from the cavity 318. For example, the central zone of the faceplate which extends completely over the wafer can include concentric gas inlets and gas outlets to deliver process gas and withdraw reacted gas from the isothermal processing zone. A suitable arrangement of concentric inlets and outlets is disclosed in commonly-assigned U.S. Pat. No. 5,614,026, the disclosure of which is hereby incorporated by reference.

Processing Zone Bounded by Ceramic Surfaces

The processing zone is preferably bounded by ceramic surfaces such as described above wherein the showerhead module 211 and substrate support 223 form an isothermal processing zone (micro-volume) in which each surface which is exposed to the isothermal processing zone is a ceramic surface which is maintained at a desired temperature. In an embodiment, the showerhead module 211 includes a faceplate 301 wherein a lower surface of the faceplate forms an upper wall of a cavity 318 and optionally a sidewall of the cavity 318 defining the isothermal processing zone, a backing plate 302, and an isolation ring 303, wherein the isolation ring 303 surrounds the faceplate 301 and the backing plate 302. The backing plate 302 can include one or more gas inlets and one or more gas outlets, and the faceplate 301 preferably includes a plurality of through holes 304 for delivering process gas to the isothermal processing zone, delivering inert gas to the isothermal processing zone, or removing process and/or inert gas from the isothermal processing zone.

Chamber Cleaning Process

The chamber cleaning process can be carried out as described in commonly-assigned U.S. Published Application 2014/0053867, the disclosure of which is hereby incorporated by reference. The cleaning method may include one or more stages. For example, introducing the cleaning mixture into the deposition chamber, exposing the interior surfaces of the deposition chamber to the cleaning mixture and reacting the residue with the cleaning mixture may be performed at a chamber pressure of at least about 0.6 Torr during the first stage and no more than about 0.6 Torr during the second stage. The plasma energy during the first stage may be less than the plasma energy during the second stage. In certain embodiments, the plasma energy is delivered at about 1,000 W to 2,000 W during the first stage and at about 2,000 W to 3,000 W during the second stage. In the embodiments where the cleaning reagents comprise an oxygen containing compound and a fluorine containing compound, the oxygen containing compound can have a flow rate of at least ten times greater than a flow rate of the fluorine containing compound during the first stage and at least three times greater during the second stage. The fluorine containing compound can be $NF_3$.

ALD Undercoat

The undercoating can be deposited as described in commonly-assigned U.S. Published Application 2015/0147482, the disclosure of which is hereby incorporated by reference. An undercoating is defined as a layer of film formed on the interior surfaces of the reaction chamber prior to processing substrates in the reaction chamber. An undercoating is distinct from film buildup that occurs during a normal deposition process where material is deposited on substrates. In contrast to buildup that occurs during deposition on substrates, an undercoating is generally deposited without any substrates present in a reaction chamber. Further, an undercoating may be deposited directly on the ceramic chamber surfaces (e.g., on aluminum nitride or aluminum oxide) whereas film deposited during deposition on substrates is typically not in contact with these surfaces if it is deposited on top of a previously formed undercoating. A substrate is a solid piece of material that may be inserted and removed from the reaction chamber, which is not part of the reaction chamber, upon which film is deposited, and upon which film deposition is generally desired. In the context of semiconductor device fabrication, a semiconductor wafer (with or without film(s) deposited thereon) is a typical substrate. In many cases, substrates are disc-shaped and have a diameter of, for example, 200, 300 or 450 mm. Substrates typically go through many rounds of processing to become semiconductor devices. Certain other substrates, however, are not intended to become fully functioning devices. These substrates may be referred to as dummy wafers, and they may be used as test vehicles for evaluating a deposition process or as sacrificial substrates for equilibrating a reaction chamber, for example. When depositing the undercoating, the substrate-free chamber allows the undercoating to uniformly coat the ceramic chamber surfaces.

An undercoating is also distinct from a layer that may be deposited on chamber surfaces during certain test cycles, for example where a deposition process is run for a relatively small number of cycles without any substrates present. One difference is that the undercoating formation process is repeated many times to form a film of a desired minimum thickness. This minimum thickness is important in ensuring that the undercoat is able to function (e.g., minimize flaking and particle formation, and maximize uniformity) as desired.

In a typical processing scheme, the reaction chamber is "clean" at the beginning of operation, i.e., there is no undercoating or other non-permanent deposited film present on the chamber surfaces. During the undercoat deposition process, a halide-free silicon precursor such as silane and a nitrogen precursor such as nitrous oxide can be flowed into the reaction chamber at the same time. A plasma is ignited in the reaction chamber, driving a gas-phase reaction between the silane and oxygen to form ALD silicon oxide. In some cases, the plasma is generated by an RF plasma generator, and the RF power used to drive the generator can be on the order of about 1000 to 3000 W (divided among four stations, depositing on 300 mm diameter substrates). The reaction chamber surfaces become coated with the undercoat film. Preferably, only the micro-volume ceramic surfaces are coated with the undercoating, i.e., the pedestal and showerhead surfaces enclosing the micro-volume. The reaction chamber can be purged/flushed multiple times to remove any unwanted reactants. The purge may include flowing gas that does not contain the species to be removed from the chamber. Alternatively or in addition, the purge may include evacuating the reaction chamber.

Pre-Coat

Reactants used to deposit films on substrates can be flowed into the reaction chamber to pre-coat the chamber surfaces before any substrates are present in the reaction chamber. This pre-coating helps prime the gas delivery hardware (e.g., liquid chemical injectors, gas delivery lines, etc.) and other portions of the apparatus by exposing them to the reactants used during deposition. The pre-coating can be deposited with halide-free or halide containing reactants. For example, when depositing silicon nitride on semiconductor substrates, the pre-coating can be deposited using the same reactants. Halide containing reactants are preferred for depositing ALD silicon nitride films since the films can be deposited at higher rates than halide-free reactants.

Silicon Nitride ALD on Semiconductor Substrates

A series of substrates can be sequentially processed in the reaction chamber after depositing the pre-coat over the undercoat. As films are deposited on the substrates, film is also deposited on the interior surfaces of the reaction chamber. This film builds up over the course of processing many substrates, and eventually begins to peel or flake off. Then, after the substrates are processed, the reaction chamber undergoes an in situ cleaning process to remove the deposited film and undercoat. This cleaning process is typically undertaken when no substrates are present in the reaction chamber. Preferably, the chamber cleaning process may involve introducing a gas phase species, e.g., a fluorine-containing compound, which reacts with the deposited film to form a volatile product that may be purged from the chamber. The processing scheme may then be repeated on the newly cleaned chamber.

Silicon-Containing Precursors

The disclosed embodiments use a halide-free silicon oxide ALD undercoating prior to depositing silicon nitride films on substrates. The silicon oxide ALD undercoating is deposited using halogen-free reactants. Any appropriate halide-free silicon-containing reactant and oxidant may be used for the deposition of silicon oxide undercoating. The silicon-containing precursor may include, for example, a silane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. An aminosilane includes at least one nitrogen atom bonded to a silicon atom, but may also contain hydrogens, oxygens, and carbons. Examples of aminosilanes are mono-, di-, tri- and tetra-aminosilane ($H_3Si(NH_2)_4$, $H_2SiNH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)-(N(CH_3)_2)_2$, $SiHCl-(N(CH_3)_2)_2$, $(Si(CH_3)_2NH)_3$ and the like. A further example of an aminosilane is trisilylamine ($N(SiH_3)_3$).

Silicon Nitride Film

The silicon nitride film is deposited via ALD using a silicon-containing film precursor which is a compound and/or reagent containing silicon which may be used to form a silicon nitride film. The silicon-containing film precursor is preferably a halosilane such as an iodosilane, bromosilane, chlorosilane or fluorosilane. For example, the chlorosilane can be monochlorosilane, dichlorosilane, tetrachlorosilane or hexachlorodisaline, the iodosilane can be diiodosilane, triiodosilane or tetraiodosilane and the bromosilane can be tetrabromosilane.

The silicon nitride film can be deposited as described in commonly-assigned U.S. Pat. Nos. 8,592,328, 8,728,956, 9,070,555 and 9,214,333 and U.S. Published Application Nos. 2016/0148800 and 2016/0148806, the disclosures of which are hereby incorporated by reference. For example, the silicon nitride film may be formed by reaction of a silicon-containing reactant and one or more of a nitrogen-containing reactant and/or a nitrogen-containing reactant blend.

Example silicon-containing reactants include, but are not limited to, bis(tertiarybutylamino)silane ($SiH_2(NHC(CH_3)_3)_2$ or BTBAS), dichlorosilane ($SiH_2Cl_2$), and chlorosilane ($SiH_3Cl$). Example nitrogen-containing reactants include, but are not limited to, ammonia, nitrogen, and tert-butyl amine (($CH_3)_3CNH_2$ or t-butyl amine). An example nitrogen-containing reactant blend, includes, but is not limited to, a blend of nitrogen and hydrogen. Alternatively, the silicon nitride film can be deposited using a halosilane such as a chlorosilane selected from tetrachlorosilane ($SiCl_4$), trichlorosilane ($HSiCl_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

The silicon nitride is preferably deposited by ALD, more preferably PEALD wherein a silicon-containing precursor is adsorbed onto an exposed surface of a semiconductor substrate supported on a pedestal of one of the stations, the silicon-containing precursor is purged from the station, a nitrogen plasma is exposed to the adsorbed silicon-containing precursor on the semiconductor substrate, and plasma is purged from the station. The stations can be located in a vacuum chamber body which maintains a low pressure environment in all stations.

The nitrogen plasma can be formed in-situ in which case the nitrogen plasma is formed directly above the substrate by igniting nitrogen gas into a plasma state inside the micro-volume or the nitrogen plasma can be formed remotely in which case nitrogen gas is ignited in a remote plasma generator upstream of the station. The plasma energy activates the nitrogen gas into ions and radicals, which react with the adsorbed layer of Si-containing precursor thereby forming silicon-nitrogen bonds and a thin film of silicon nitride. The purge steps can be carried out by stopping flow of the silicon-containing precursor and nitrogen gases and delivering a carrier gas into the micro-volume. The carrier gas can be supplied continuously throughout the ALD process or intermittently during the purge steps. Each deposition cycle of the ALD process can deposit a silicon nitride film having a thickness of about 0.05 Å to about 3 Å. For example, deposition at about 250° C. using disilane can deposit about 0.5 Å per cycle.

In an example, silicon nitride can be deposited by repeated cycles of delivering bis(diethyl)aminosilane with Ar carrier gas to a station, purging, igniting a nitrogen plasma, purging, to form a silicon nitride film of about 0.5 Å in thickness each cycle. In another example, silicon nitride can be deposited by repeated cycles of delivering trisilylamine with Ar carrier gas to a station, purging, igniting a nitrogen or ammonia plasma, purging, to form a silicon nitride film of about 0.5 Å in thickness each cycle.

As an alternative to silicon nitride films, the semiconductor substrates can be coated with other film materials such as conductive and semiconductive materials. For example, the film can be a nitride, oxide, carbide, boride, or other desired film material including but not limited to silicon oxide, oxynitride, doped oxide, doped silicate glass, undoped silicate glass(USG) such as boron doped silicate glass (BSG), phosphorus doped silicate glass (PSG), and boron phosphorus doped silicate glass (BPSG).

Examples

The following Table sets forth examples of undercoat film compositions, deposition modes, gas chemistries, conformality, thicknesses and times to deposit the films.

| Ex. | Undercoat film | Deposition mode | Gas chemistry | Silicon precursor | conformality | Thickness (Å) | Time (min) |
|---|---|---|---|---|---|---|---|
| 1 | $SiO_2$ | ALD | BTBAS, $O_2$, Ar | Non-halide | >95% | 1,100 | 100 |
| 2 | $SiO_2$ | ALD | Dichlorosilane, $N_2O$, $N_2$ | halide | >95% | 1,260 | 2,226 |
| 3 | $SiO_2$ | PECVD | $SiH_4$, $N_2O$, $N_2$ | Non-halide | <50% | 50,000 | 8 |
| 4 | $SiO_2$ | ALD | Dichlorosilane, $NH_3$ | halide | >95% | 1,000 | 28 |

Figure 5:
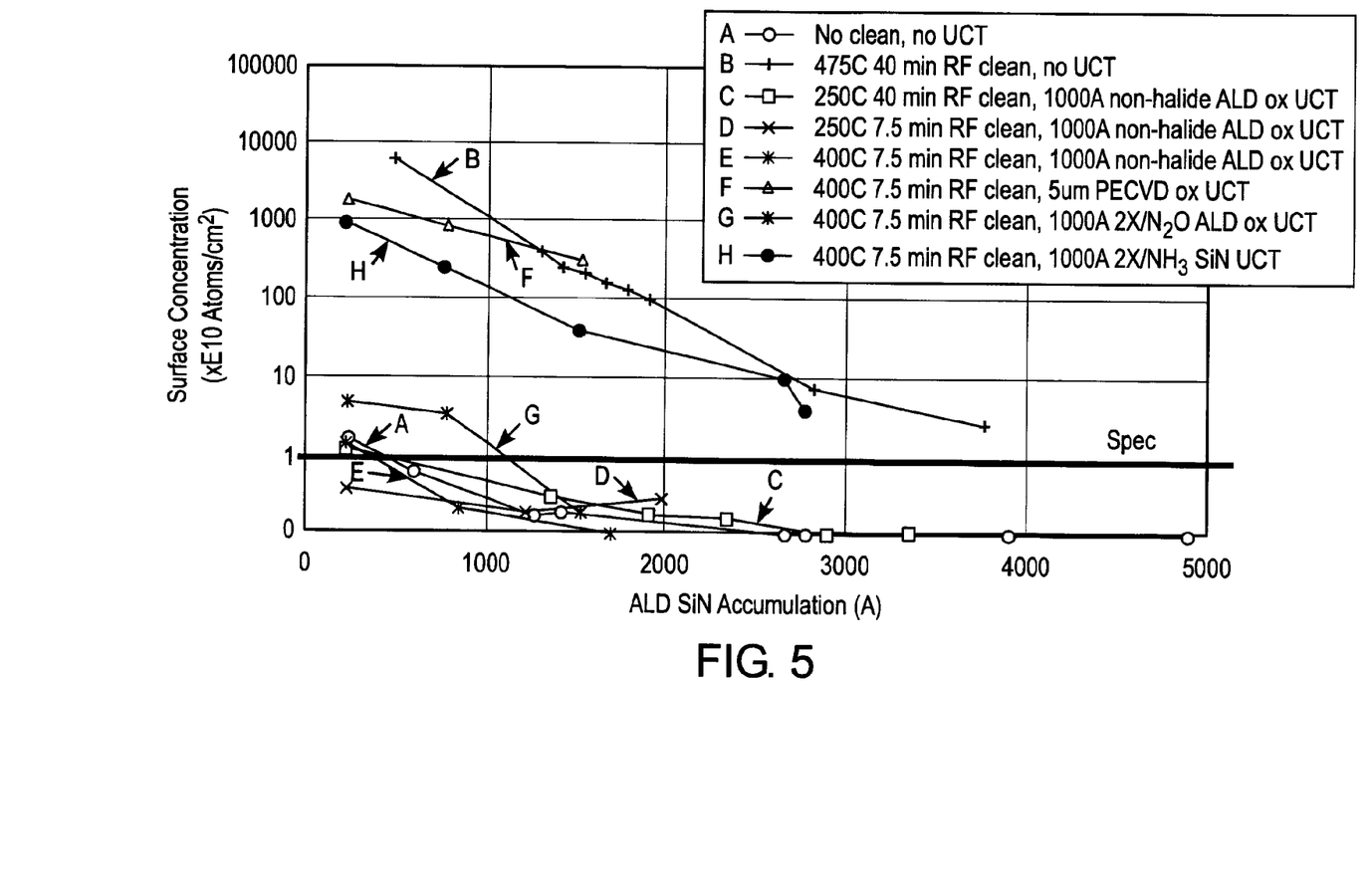
FIG. 5 is a graph of surface contamination versus ALD SiN accumulation for eight chamber conditions.

FIG. 5 shows surface concentration of Al versus ALD SiN accumulation for 8 chamber conditions (A-H) in which ALD silicon nitride is deposited at 475° C. using dichorosilane and $NH_3$. Curve A illustrates surface contamination drops within desired specification limits after accumulation of about 500 Å of ALD silicon nitride film on surfaces of a chamber which is not cleaned and there is no undercoat. Curve B illustrates surface contamination is above specification limits for a chamber which has been subjected to a 40 minute RF clean at 475° C. and there is no undercoat. Curve C illustrates that surface contamination is within specification limits after a 40 minute RF clean at 250° C. followed by deposition of 1000 Å of a non-halide ALD silicon oxide undercoat. Curve D illustrates surface contamination is within specification limits after a 7.5 minute RF clean at 250° C. followed by deposition of 1000 Å of a non-halide ALD silicon oxide undercoat. Curve E illustrates surface contamination is within specification limits after a 7.5 minute RF clean at 400° C. followed by deposition of 1000 Å of a non-halide ALD silicon oxide undercoat. Curve F illustrates surface contamination is above specification limits after a 7.5 minute RF clean at 400° C. followed by deposition of 5 microns of a PECVD silicon oxide undercoat. Curve G illustrates surface contamination is above specification limits after a 7.5 minute RF clean at 400° C. followed by deposition of 1000 Å of a halide (dichlorosilane and $N_2O$) ALD silicon oxide undercoat. Curve H illustrates surface contamination is above specification limits after a 7.5 minute RF clean at 400° C. followed by deposition of 1000 Å of a halide (dichlorosilane and $NH_3$) ALD silicon oxide undercoat until silicon nitride buildup reaches about 1000 Å. As shown by Curves C, D and E, use of a 1000 Å thick non-halide based ALD oxide undercoating provides significant reduction in surface contamination compared to a 1000 Å thick halide-based ALD oxide undercoating (Curve G), a 5 micron thick PECVD oxide undercoating (Curve F) or a 1000 Å thick halide-based silicon nitride undercoating (Curve H).

As used herein, the term "about" when used in connection with a numerical value, is intended to include a tolerance of ±10% around the stated numerical value.

While various aspects of conditioning a chamber and depositing ALD silicon nitride film have been described in detail with reference to specific embodiments thereof, it will be apparent to those skilled in the art that various changes and modifications can be made, and equivalents employed, without departing from the scope of the appended claims.

What is claimed is:

1. A method of depositing films on semiconductor substrates processed in a micro-volume of a plasma enhanced atomic layer deposition (PEALD) reaction chamber wherein a single semiconductor substrate is supported on a ceramic surface of a pedestal and process gas is introduced through gas outlets in a ceramic surface of a showerhead into a reaction zone above the semiconductor substrate, the method comprising:
   (a) cleaning the ceramic surfaces of the pedestal and showerhead with a fluorine plasma such that aluminum-rich byproducts are formed on the ceramic surfaces;
   (b) depositing a conformal halide-free atomic layer deposition (ALD) oxide undercoating on the ceramic surfaces so as to cover the aluminum-rich byproducts;
   (c) depositing a pre-coating on the halide-free ALD oxide undercoating; and
   (d) processing a batch of semiconductor substrates by transferring each semiconductor substrate into the reaction chamber and depositing a film on the semiconductor substrate supported on the ceramic surface of the pedestal.

2. The method of claim 1, wherein step (b) is carried out by (i) introducing a flow of a halogen-free silicon-containing first reactant in vapor phase into the reaction chamber and allowing the first reactant to adsorb onto the interior surfaces of the reaction chamber; (ii) introducing a flow of an oxygen-containing second reactant in vapor phase into the reaction chamber while the first reactant is adsorbed on the interior surfaces of the reaction chamber; and (iii) exposing the reaction chamber to plasma when the flow of at least one of the first and second reactants has ceased, in order to drive a reaction between the first and second reactants on the interior surfaces of the reaction chamber to form the undercoating, where the undercoating conformally coats the interior surfaces of the reaction chamber; wherein operations (i)-(iii) occur when there is no substrate present in the reaction chamber, and wherein operations (i)-(iii) are repeated until the undercoating is at least about 500 Å thick.

3. The method of claim 1, wherein the ceramic surfaces of the showerhead and pedestal are aluminum nitride.

4. The method of claim 1, wherein step (a) is carried out at with the pedestal and showerhead at a temperature below 400° C.

5. The method of claim 1, wherein step (c) is carried out with the pedestal and showerhead at a temperature above 400° C.

6. The method of claim 1, wherein the undercoating is deposited to a thickness of at least 500 Å.

7. The method of claim 1, wherein step (c) is carried out with the pedestal and showerhead at a temperature of about 475° C. to about 635° C.

8. The method of claim 1, wherein step (a) is carried out with the pedestal and showerhead at a temperature below 300° C.

9. The method of claim 1, wherein step (a) is carried out with $NF_3$ energized into a plasma state upstream from the micro-volume using a remote inductively coupled plasma generator.

10. The method of claim 1, wherein step (a) is carried out by flowing $NF_3$ into the micro-volume and energizing the $NF_3$ into a plasma state within the micro-volume by applying RF power to an embedded RF electrode in the showerhead.

11. The method of claim 1, wherein step (b) is carried out by (i) flowing $SiH_4$ into the reaction chamber and allowing the $SiH_4$ to absorb on the interior surfaces, (ii) flowing $O_2$ into the reaction chamber and allowing the $O_2$ to absorb onto the interior surfaces, (iii) exposing the interior surfaces to plasma when the flow of at least one of the $SiH_4$ and $O_2$ has ceased to drive a reaction between the $SiH_4$ and $O_2$ and form a monolayer of ALD silicon oxide undercoating.

12. The method of claim 1, wherein the PEALD reaction chamber is a multi-station reactor with four micro-volumes, the method comprising carrying out steps (a)-(d) in each of the micro-volumes.

13. The method of claim 1, wherein step (a) comprises an RF clean lasting 5 to 10 minutes and step (b) comprises depositing a non-halide ALD silicon oxide undercoating with a thickness of 500 to 2000 Å.

14. The method of claim 1, wherein step (c) comprises: (i) introducing a flow of a halosilane first reactant in vapor phase into the reaction chamber and allowing the first reactant to absorb onto interior surfaces of the reaction chamber; (ii) introducing a flow of a nitrogen-containing second reactant in vapor phase into the reaction chamber while the first reactant is absorbed on the interior surfaces of the reaction chamber; and (iii) exposing the reaction chamber to plasma when the flow of at least one of the first and second reactants has ceased, in order to drive a reaction between the first and second reactants on the interior surfaces of the reaction chamber to form the pre-coating.

15. The method of claim 14, wherein the pre-coating conformally coats the interior surfaces of the reaction chamber.

16. The method of claim 14, wherein (i)-(iii) occur when there is no semiconductor substrate present in the reaction chamber.

17. The method of claim 14, wherein (i)-(iii) are repeated until the pre-coating is at least 500 Å thick.

18. The method of claim 1, wherein step (d) is carried out by (i) introducing a flow of a halosilane first reactant in vapor phase into the reaction chamber and allowing the first reactant to absorb onto an exposed surface of a semiconductor substrate in the reaction chamber; (ii) introducing a flow of a nitrogen-containing second reactant in vapor phase into the reaction chamber while the first reactant is absorbed on the exposed surface of the semiconductor substrate; and (iii) exposing the reaction chamber to plasma when the flow of at least one of the first and second reactants has ceased, in order to drive a reaction between the first and second reactants on the exposed surface of the semiconductor substrate to form a silicon nitride film on the semiconductor substrate.

* * * * *